United States Patent [19]

Throngnumchai

[11] Patent Number: 5,473,276
[45] Date of Patent: Dec. 5, 1995

[54] MOS TYPE POWER SEMICONDUCTOR SWITCHING DEVICE CAPABLE OF PROTECTING LOAD SHORTCIRCUIT PROBLEM UNDER LOW HEAT DISSIPATION

[75] Inventor: Kraisorn Throngnumchai, Yokohama, Japan

[73] Assignee: Nissan Motor Co., Ltd., Yokohama, Japan

[21] Appl. No.: 405,455

[22] Filed: Mar. 16, 1995

Related U.S. Application Data

[63] Continuation of Ser. No. 61,998, May 17, 1993, abandoned.

[30] Foreign Application Priority Data

May 15, 1992 [JP] Japan ..................... 4-123047

[51] Int. Cl.$^6$ ............... H01L 29/78; G05F 1/56
[52] U.S. Cl. ............... 327/432; 333/214; 327/498
[58] Field of Search ............... 361/18; 327/432, 327/498; 333/214

[56] References Cited

U.S. PATENT DOCUMENTS

| | | | |
|---|---|---|---|
| 4,553,084 | 11/1985 | Wrathall | 323/316 |
| 4,893,158 | 1/1990 | Mihara et al. | 361/91 |
| 4,896,199 | 1/1990 | Tsuzuki et al. | 357/28 |
| 5,138,516 | 8/1992 | Chapman | 361/18 |
| 5,303,110 | 4/1994 | Kumagai | 361/18 |

FOREIGN PATENT DOCUMENTS

| | | |
|---|---|---|
| 64-68005 | 3/1989 | Japan . |
| 2-226407 | 9/1990 | Japan . |

OTHER PUBLICATIONS

Dolny, et al, "Silicon–on–Insulator Approach for Power IC's Integrating Vertical DMOS and Polycrystalline–Silicon CMOS Thin–Film Transistors", *IEEE Electron Device Letters*, vol. 13, No. 10: pp. 516–518, Oct. (1992).

Robb, et al, "Industry Trends in Power Integrated Circuits", *IEDM*: pp. 792–795 (1988).

*Primary Examiner*—Peter S. Wong
*Assistant Examiner*—Shawn Riley
*Attorney, Agent, or Firm*—Foley & Lardner

[57] ABSTRACT

In an MOS type power switching device, no leak current flows during an OFF-state, and a high current driveability is realized during a normal load condition. Furthermore, a drive current is reduced during a short-circuited load condition. The MOS (metal-oxide semiconductor) type power switching device with a drain terminal, a source terminal and a gate terminal, includes: a MOS type power switching element whose drain is connected to the drain terminal and whose source is connected to the source terminal; a MOS type semiconductor device whose drain is connected to the drain of the MOS type power switching element and whose gate is connected to the gate terminal together with a gate of the MOS type power switching element; a bipolar semiconductor controlling element whose collector is connected to the gate terminal together with both of the gates of the MOS type power switching element and of the MOS type semiconductor element, and whose emitter is connected to the source terminal together with the source of the MOS type power switching element; and a current limiting element connected between a source of the MOS type semiconductor device and a base of the bipolar type controlling element in such a manner that when no gate biasing voltage is applied to the gate terminal, at least MOS type semiconductor device is turned OFF, whereby no current flows from the drain terminal to the source terminal through any current paths. This current limiting element is a resistor.

16 Claims, 8 Drawing Sheets

MOS TYPE POWER SEMICONDUCTOR SWITCHING DEVICE CAPABLE OF PROTECTING LOAD SHORTCIRCUIT PROBLEM UNDER LOW HEAT DISSIPATION

This application is a continuation of application Ser. No. 08/061,998, filed May 17, 1993 now abandoned.

BACKGROUND OF THE INVENTION

1. Field of the Invention

The present invention generally relates to a MOS type power semiconductor switching device with a device protection against load short-circuit problems. More specifically, the present invention is directed to a MOS (metal-oxide semiconductor) type power switching device capable of preventing under low heat dissipation the MOS type power switching device from being heated and possibly destroyed due to an occurrence of an extraordinary condition such as a short-circuit in the load.

2. Description of the Prior Art

Various MOS types of power semiconductor switching devices have been proposed in the semiconductor device field. For instance, Japanese Laid-open (KOKAI DISCLOSURE) patent application No. 64-68005 opened in 1989 discloses a power MOSFET switching device 7 with a load protection function. An internal circuit of this power MOSFET switching device is shown in FIG. 1A and an I-V (current-to-voltage) characteristic thereof is presented in FIG. 1B. As indicated in FIG. 1A, this power MOSFET switching device 7 is constructed of a power MOSFET "FET$_1$", a MOSFET "FET$_2$", and a bipolar transistor "Tr$_1$". The typical operation of this power MOSFET switching device 7 is performed as follows. Power consumption within the chip of the power MOSFET "FET$_1$" is detected based on a combination of the drain-to-source voltage "$V_{DS}$" of this MOSFET and the drain current "$I_D$", when the detected power consumption reaches a predetermined condition, the gate-to-source voltage "$V_{GS}$" is turned OFF thereby turning OFF this power MOSFET "FET$_1$". As a result, the power MOSFET switching device 7 can be continuously operated within the area of safety operation (abbreviated "ASO") of this power MOSFET (see FIG. 1B).

As previously explained, since the above-described conventional power MOSFET switching device 7 is continuously operated within the ASO region thereof, this MOSFET switching device 7 may not be electrically destroyed due to over power consumption. As a result, the MOSFET switching device 7 may be prevented from being over-heated due to an occurrence of extraordinary load condition, and thereafter electrically destroyed.

In FIG. 2, there is shown one example in which the above-described power MOSFET switching device 7 is employed to drive a load "$R_L$". FIG. 2A shows a circuit diagram of this load drive circuit and FIG. 2B represents an I-V characteristic of the power MOSFET switching device 7. As shown in FIG. 2A, the drain of this power MOSFET switching device 7 is connected via the load $R_L$ to a power supply (not shown) at a voltage of "$V_{DD}$", a source of this switching device 7 is grounded, and a gate thereof is connected via a resistor "$R_{IN}$" to a gate drive voltage "$V_{IN}$".

When an extraordinary condition, e.g., a short-circuit happens to occur in the load $R_L$, since the voltage $V_{DD}$ of the power supply is directly applied to the drain of this power MOSFET switching device 7, the operating point of this circuit is removed to a point "O", as shown in FIG. 2B However, this new operating point "O" is located within the ASO region indicated by a dot line of FIG. 2B, so that this power MOSFET switching device 7 is effectively protected.

The above-described power MOSFET switching device 7 with the load protection function has the following problems.

First, as apparent from the circuit diagram shown in FIG. 1A, since the drain "D" of the power MOSFET "FET$_1$" is connected via a series circuit or resistors $R_1$ and $R_2$ to the source "S" thereof, even when this MOSFET "FET$_1$" is turned OFF by applying no gate voltage, a current "$I_2$" may flow from this drain "D" via the resistors $R_1$ and $R_2$ to the source "S". As a result, a large leak current may be present under such a condition that the power MOSFET switching device 7 is turned OFF, resulting in high power consumption.

Another conventional power MOSFET switching device utilized in a current sensing circuit is described in U.S. Pat. No. 4,553,084 to Wrathall, issued on Nov. 12, 1985. This conventional circuit is so-called "current mirror type load protection circuit".

FIG. 3 indicates this current mirror type load protection circuit, and FIG. 4 partially indicates an I-V characteristic of a power MOSFET switching device 10A employed in this current mirror type load protection circuit (see a curve "20"). As easily understood from FIG. 4, the drain current of the power MOSFET switching device 10A is limited to a peak drain current "$I_{D\text{-}P}$" when a load 12 is short-circuited in this current mirror type protection circuit.

However, such a conventional current mirror type protection circuit has the following problems. That is, since power consumption of the power MOSFET 10A is a product of a current flowing through this MOSFET 10A and an applied voltage thereof, when the applied voltage becomes high under a condition when the current value is a constant, the resultant power consumption becomes large. Thus, an area of safety operation represents such a characteristic curve whose right portion is lowered. As previously explained, since the current value becomes constant at the peak current value "$I_{D\text{-}P}$" (See FIG. 4), if the load 12 is short-circuited, the voltage $V_{DD}$ of the power supply is directly applied to the power MOSFET switching device 10A. As a consequence, the power consumption "P" of the power MOSFET 10A under short-circuited load condition is defined by:

$$P = I_{D\text{-}P} \times V_{DD}.$$

The resultant power consumption "P" is of rather high value, and therefore high heat dissipation may occur. In other words, since this power MOSFET switching device must be designed to be safely operated even with such a high heat condition (namely, ASO region should be broadened), the dimensions of this switching device should be made large and a degree of freedom is designing heat dissipation would be lowered.

SUMMARY OF THE INVENTION

The present invention has ben made in an attempt to solve the above-described problems of the conventional MOS type power semiconductor switching devices, and therefore, has an object to provide a MOS type power semiconductor switching device with a protection function capable of greatly reducing power consumption of the switching device during an occurrence of an abnormal condition, e.g., a short-circuited load condition.

Another object of the present invention is to provide a MOS type power switching device having a very small peak current under turn-OFF state.

A still further object of the present invention is to provide a MOS type power switching device with low heat dissipation, capable of being utilized at such places, e.g., inside an automobile where an operator may directly touch this switching device even during the occurrence of such an abnormal condition.

A MOS type power semiconductor switching device (100), according to one aspect of the present invention, includes a MOS type power switching element (101) whose drain is connected to a drain terminal (D) and whose source is connected to a source terminal (S), a MOS type semiconductor device (102) whose drain is connected to the drain of the MOS type power switching element (101) and whose gate is connected to the gate terminal (G) together with a gate of said MOS type power switching element (101), a bipolar semiconductor controlling element (103) whose collector is connected to the gate terminal (G) together with both the gates of the MOS type power switching element (101) and of the MOS type semiconductor element (102), and whose emitter is connected to the source terminal (S) together with the source of the MOS type power switching element (101), and a current limiting element (104) connected between a source of the MOS type semiconductor device (102) and a base of the bipolar type controlling element (103) in such a manner that when no gate biasing voltage ($V_{IN}$) is applied to the gate terminal (G), at least the MOS type semiconductor device (102) is turned OFF, whereby no current flows from the drain terminal (D) to the source terminal (S) through any current paths.

According to another aspect of the present invention, a MOS (metal-oxide semiconductor) type power switching device (200:250) with a drain terminal (D), a source terminal (S) and a gate terminal (G), includes a MOS type power switching element (101) whose drain is connected to a drain terminal (D) and whose source is connected to a source terminal (S), a MOS type semiconductor device (102) whose drain is connected to the drain of the MOS type power switching element (101) and whose gate is connected to the gate terminal (G) together with a gate of said MOS type power switching element (101), a bipolar semiconductor controlling element (103) whose collector is connected to the gate terminal (G) together with both of the gates of the MOS type power switching element (101) and of the MOS type semiconductor element (102), and whose emitter is connected to the source terminal (S) together with the source of the MOS type power switching element (101), and a forward biasing voltage controlling element (106:106B) connected between a source of said MOS type semiconductor device (102) and a base of said bipolar type controlling element (103), for controlling a forward biasing voltage ($V_F$) applied between the base and emitter of the bipolar type controlling element (103).

A MOS (metal-oxide semiconductor) type power switching device (300) with a drain terminal (D), a source terminal (S) and a gate terminal (G), includes a MOS type power switching element (101) whose drain is connect to a drain terminal (D) and whose source is connected to a source terminal (S), a MOS type semiconductor device (102) whose drain is connected to the drain of the MOS type power switching element (101) and whose gate is connected to the gate terminal (G) together with a gate of said MOS type power switching element (101), a bipolar semiconductor controlling element (103) whose collector is connected to the gate terminal (G) together with both of the gates of the MOS type power switching element (101) and of the MOS type semiconductor element (102), and whose emitter is connected to the source terminal (S) together with the source of the MOS type power switching element (101), and a resistor (108) connected between an emitter of the bipolar type controlling element (108) and the source of said MOS type switching device (101) in order to control both of a peak drain current ($I_{D-P}$) of the MOS type power switching device (300) and a peak drain voltage ($V_{DS-P}$) thereof.

A MOS (metal-oxide semiconductor) type power switching device (400:450) with a drain terminal (D), a source terminal (S) and a gate terminal (G), includes a MOS type power switching element (101) whose drain is connected to a drain terminal (D) and whose source is connected to a source terminal (S), a MOS type semiconductor device (102) whose drain is connected to the drain of the MOS type power switching element (101) and whose gate is connected to the gate terminal (G) together with a gate of the MOS type power switching element (101), a bipolar semiconductor controlling element (103) whose collector is connected to the gate terminal (G) together with both of the gates of the MOS type power switching element (101) and of the MOS type semiconductor element (102), and whose base is connected to a source of said MOS type semiconductor device (102), and a forward biasing voltage controlling element (109:109B) connected between an emitter of the bipolar type semiconductor controlling element (103) and the source of the MOS type power switching element (101), for controlling a forward biasing voltage ($V_{F3}$, $F_{F4}$) applied between the base and emitter of the bipolar type controlling element (103).

A MOS (metal-oxide semiconductor) type power switching device (500) with a drain terminal (D), a source terminal (S) and a gate terminal (G), includes a MOS type power switching element (101) whose drain is connected to a drain terminal (D) and whose source is connected to a source terminal (S), a MOS type semiconductor device (102) whose drain is connected to the drain of the MOS type power switching element (101) and whose gate is connected to the gate terminal (G) together with a gate of said MOS type power switching element (101), a bipolar semiconductor controlling element (103) whose collector is connected to the gate terminal (G) together with both of the gates of the MOS type power switching element (101) and of the MOS type semiconductor element (102), a diode (106) connected between a source of the MOS type semiconductor device (102) and a base of the bipolar type controlling element (103), and a resistor (108) connected between an emitter of the bipolar type controlling element (103) and the source of the MOS type power switching element (101) when no gate biasing voltage ($V_{IN}$) being applied to the gate terminal (G), at least said MOS type semiconductor device (102) being turned OFF, whereby no current is transmitted from the drain terminal (D) to the source terminal (S) through any current paths.

According to a still further aspect of the present invention, a MOS (metal-oxide semiconductor) type power switching device (600) with a drain terminal (D), a source terminal (S) and a gate terminal (G), includes a MOS type power switching element (610) whose drain is connected to the drain terminal (D) and whose source is connected to the source terminal (S), a first MOS type semiconductor device (611) whose drain is connected to the drain switching element (610) and whose gate is connected to the gate terminal (G) together with a gate of the MOS type power switching element (610), a second MOS type semiconductor device (612) whose drain is commonly connected to both of the drains of the MOS type power switching element (610) and the first MOS type semiconductor device (611), and whose gate is commonly connected to both of the gates of the MOS type power switching element (610) and the first MOS type semiconductor device (611), a bipolar semiconductor controlling element (613) whose collector is connected to the gate terminal (G) together with the gates of the MOS type power switching element (610) and of the first and second MOS type semiconductor devices (611:612), whose emitter is connected to said source terminal (S), a first resistor (614) connected between a source of the second MOS type semiconductor device (612) and a base of the bipolar type controlling element (613), and a second resistor (615) parallel-connected between the base of the bipolar type controlling element (613) and the emitter thereof, when no gate biasing voltage ($V_{IN}$) being applied to the gate terminal (G), at least the second MOS type semiconductor device (612) being turned OFF, whereby no current is transmitted from the drain terminal (D) to the source terminal (S) through any current paths.

DETAILED DESCRIPTION OF THE PREFERRED EMBODIMENTS

Circuit Arrangement of First MOS Type Switching Device 100

Figure 5A:
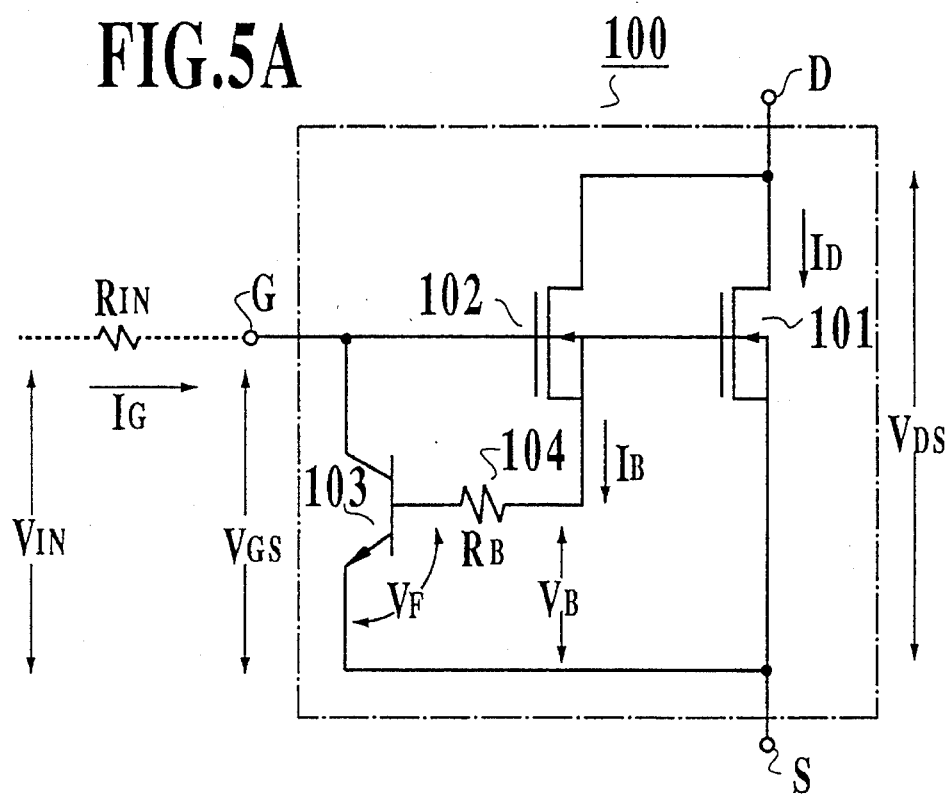
FIG. 5A shows an internal circuit arrangement of a MOS type power switching device 100 according to a first preferred embodiment of the present invention.

FIG. 5A is a circuit diagram for showing an internal circuit arrangement of a MOS type power semiconductor switching device 100 according to a first preferred embodiment of the present invention.

In FIG. 5A, the first MOS type power semiconductor switching device 100 is arranged by a MOS type power switching element 101, a MOS type semiconductor device 102, a bipolar type semiconductor controlling element 103, and a resistor 104 having a resistance value of $R_B$ connected between a source of the MOS type semiconductor device 102 and a base of the bipolar type semiconductor controlling element 103. The MOS type power switching element 101 may be selected from a power MOSFET (metal-oxide-semiconductor field-effect transistor) and an IGBT (insulated gate bipolar transistor). The MOS type semiconductor device 102 may be selected from a vertical MOSFET, a lateral MOSFET, a vertical IGBT, a lateral IGBT, and a TFT (thin film transistor). Also, the bipolar type semiconductor controlling element 103 may be selected from a bipolar transistor and a TFT type bipolar transistor.

Precisely speaking, a drain and a gate of the MOS type power switching element 101 are connected to a drain and a gate of the MOS type semiconductor device 102, respectively. A collector of the bipolar type controlling element 103 is connected to the respective gates of the MOS type power switching element 101 and the MOS type semiconductor device 102. An emitter of this bipolar type controlling element 103 is connected to a source of the MOS type power switching element 101. A base of the bipolar type controlling element 103 is connected via the resistor 104 to a source of the MOS type semiconductor device 102. These circuit elements 101 to 104 constitute the above-described first MOS type power switching device 100 having three terminals "D", "S" and "G" to which preselected voltages $V_{DS}$, $V_{GS}$ are applied (will be discussed later).

Operation of First MOS Type Switching Device 100

Referring now to FIG. 5A, an operation of the first MOS type switching device 100 will be described.

While no gate voltage $V_{GS}$ is applied to the gate terminals "G" of this first MOS type power switching device 100, and therefore, the MOS type power switching element 101 and the MOS type semiconductor device 102 are turned OFF, no current flows from the drain terminal "D" of the first MOS type power switching device 100 to the source terminal "S" thereof, because no current path is established from the drain terminal "D" to the source terminal "S". As a consequence, the first MOS type power switching device 100 has a smaller leak current than the leak current of the first-mentioned conventional MOS type power switching device indicated in FIG. 1A. Then, power consumption of the first MOS type power switching device 100 can be considerably reduced under turn-OFF state, as compared with this conventional MOS type power switching device.

A further detailed operation of the first MOS type power switching device 100 will now be described with reference to I-V (current-to-voltage) characteristics shown in FIG. 5B. It should be noted that various currents and voltages of $I_D$, $I_B$, $I_G$, $V_{DS}$, $V_B$, $V_{GS}$, $V_F$ and $V_{IN}$ denote various currents and voltages appearing in the internal circuit of FIG. 5A. Symbol "$R_{IN}$" implies a resistance value of an input resistor.

Figure 5B:
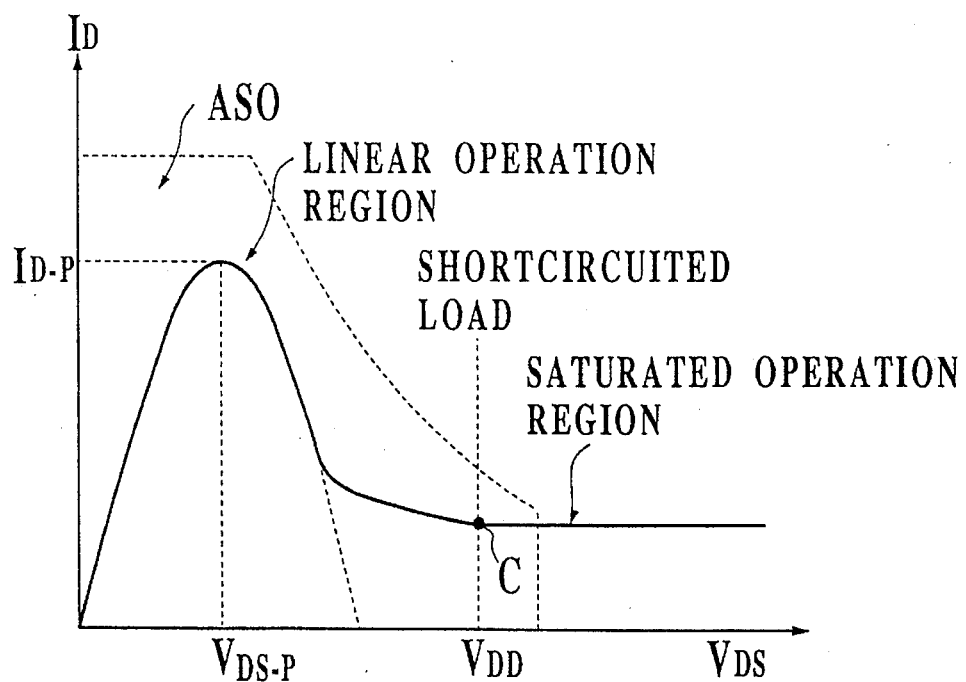
FIG. 5B represents I-V characteristics of the first MOS type power switching device 100.

Referring back to the I-V characteristics diagram of FIG. 5B, while the MOS type power switching element 101 is operated within a linear region, the following equation 1 is satisfied:

$$I_D = K V_{DS}(V_{GS} - V_T) \quad (1),$$

where symbol "K" indicates a constant, and symbol "$V_T$" denotes a threshold voltage of this MOS type power switching element 101.

Next, assuming now that the ON-resistance value of the MOS type semiconductor element 102 is considerably lower than the resistance value "$R_B$" of the resister 104, namely a negligibly low value, and also a forward biasing voltage between the base and the emitter of the bipolar type semiconductor controlling element 103 is indicated as "$V_F$", the below-mentioned equation (2) is satisfied:

$$V_B = V_F + I_B R_B \approx V_{DS} \quad (2).$$

In general, when this bipolar type semiconductor controlling element 103 is made of silicon (Si), the typical threshold voltage $V_F$ is given as follows:

$$V_F = 0.4 \text{ to } 0.7 \text{ V}.$$

If the above-explained equation (2) is modified, then another equation (3) is obtained:

$$I_B = (V_{DS} - V_F) / R_B \quad (3).$$

Then, assuming now that a current amplification factor of the bipolar type controlling element 103 is "β(beta)", the following equation (4) is satisfied:

$$I_G = \beta I_B$$

namely, $$V_{GS} = V_{IN} - R_{IN} I_G$$

$$V_{GS} = V_{IN} - \beta R_{IN} I_B$$

$$V_{GS} = V_{IN} - \beta \cdot (V_{DS} - V_F) \cdot R_{IN} / R_B \quad (4).$$

Based on the above-defined equations (1) and (4), the I-V characteristics in the linear operation region as shown in FIG. 5B are obtained. That is, the linear I-V characteristics are defined as follows:

$$I_D = K V_{DS} \left( V_{IN} - \frac{\beta R_{IN}}{R_B} \cdot V_{DS} + \frac{\beta R_{IN}}{R_D} \cdot V_F - V_T \right) \quad (5)$$

To the contrary, when the drain-to source voltage "$V_{DS}$" of the first MOS type power switching device 100 becomes high, the operation conditions of both the MOS type power switching element 101 and the MOS type semiconductor device 102 are brought into the saturated operation region (see FIG. 5B). As a result, the drain current "$I_D$" becomes constant.

A peal drain voltage "$V_{DS-P}$" under condition that the drain current "$I_D$" becomes a peak drain current "$I_{D-P}$", is calculated by the following equation (6):

$$V_{DS-P} = \frac{V_F}{2} + \frac{R_B}{2 \beta R_{IN}} (V_{IN} - V_T). \quad (6)$$

Device Destroy Protection of First MOS Type Power Switching Device 100

As seen from the I-V characteristics of FIG. 5B, when the drain voltage "$V_{DS}$" Of the first MOS type power switching device 100 is increased, then the drain current "$I_D$" thereof is similarly increased, and thereafter reaches a peak drain current "$I_{D-P}$" at a certain drain voltage "$V_{DS-P}$" (namely, a "peak" drain voltage). When this drain voltage $V_{DS}$ is further increased toward the supply voltage "$V_{DD}$", the drain current "$I_D$" is decreased In other words, this first MOS type power switching device 100 represents a negative resistance characteristic, so that although the drain voltage $V_{DS}$ is increased, the drain current $I_D$ is decreased and thereafter become substantially constant (namely, saturated operation region).

Figure 1A:
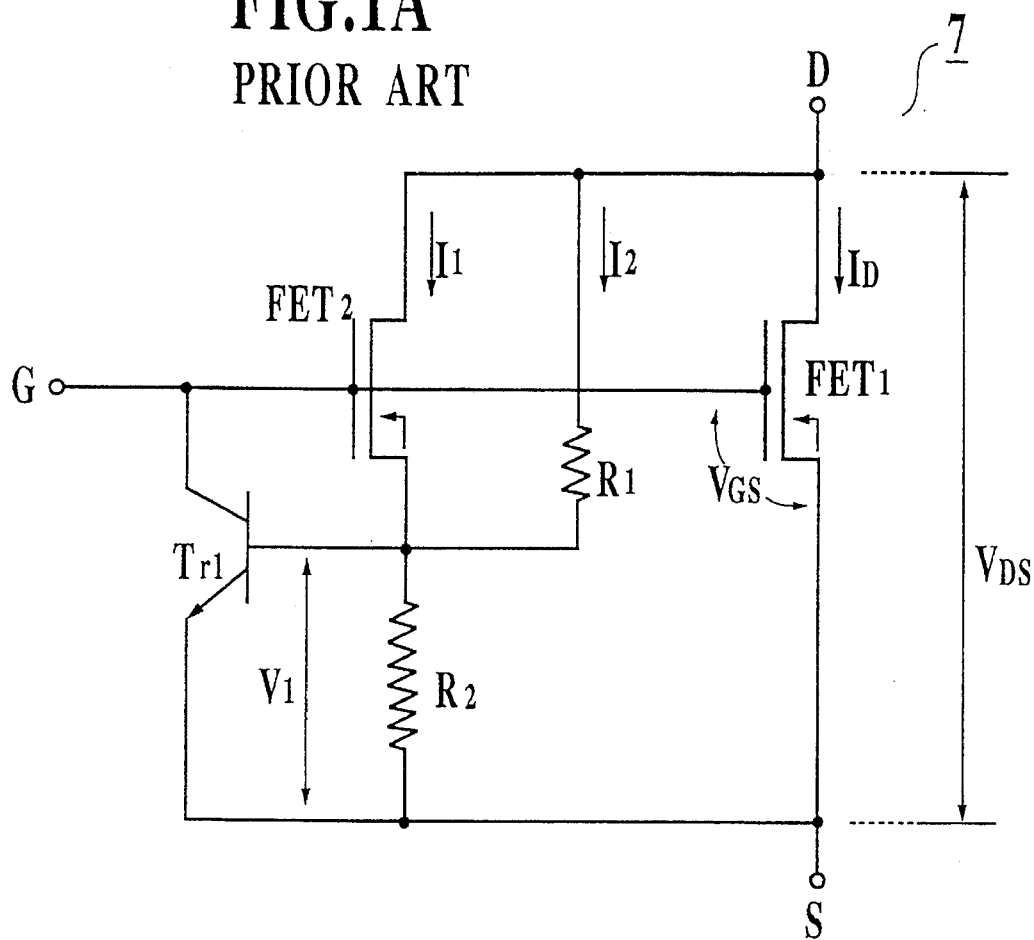
FIG. 1A is an internal circuit diagram of a conventional MOS type power semiconductor switching device.
Figure 1B:
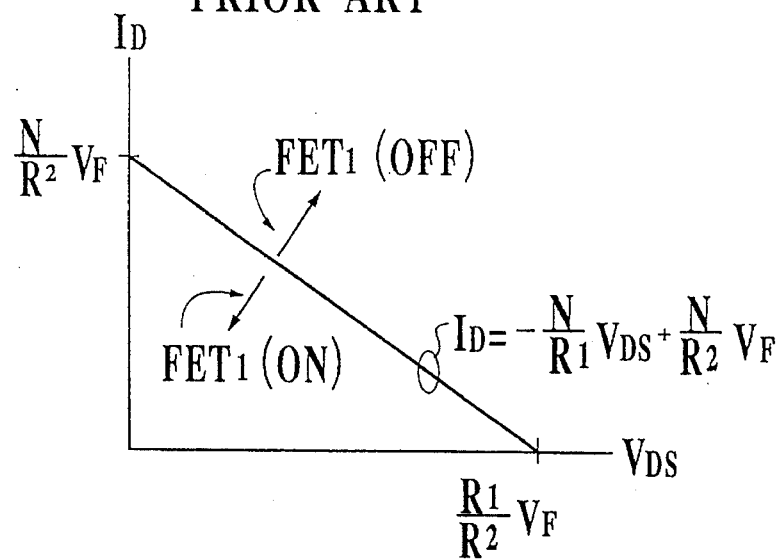
FIG. 1B represents I-V characteristics of this switching device.
Figure 2A:
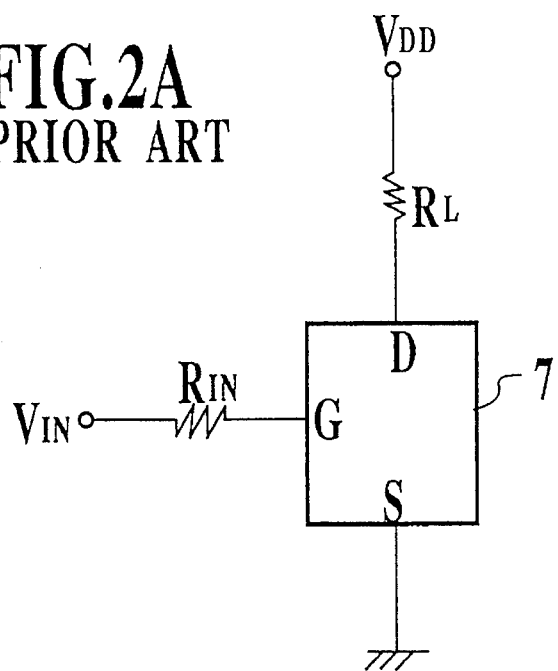
FIG. 2A schematically shows a circuit arrangement of a load drive circuit employing the conventional MOS type power switching device shown in FIG. 1A.
Figure 2B:
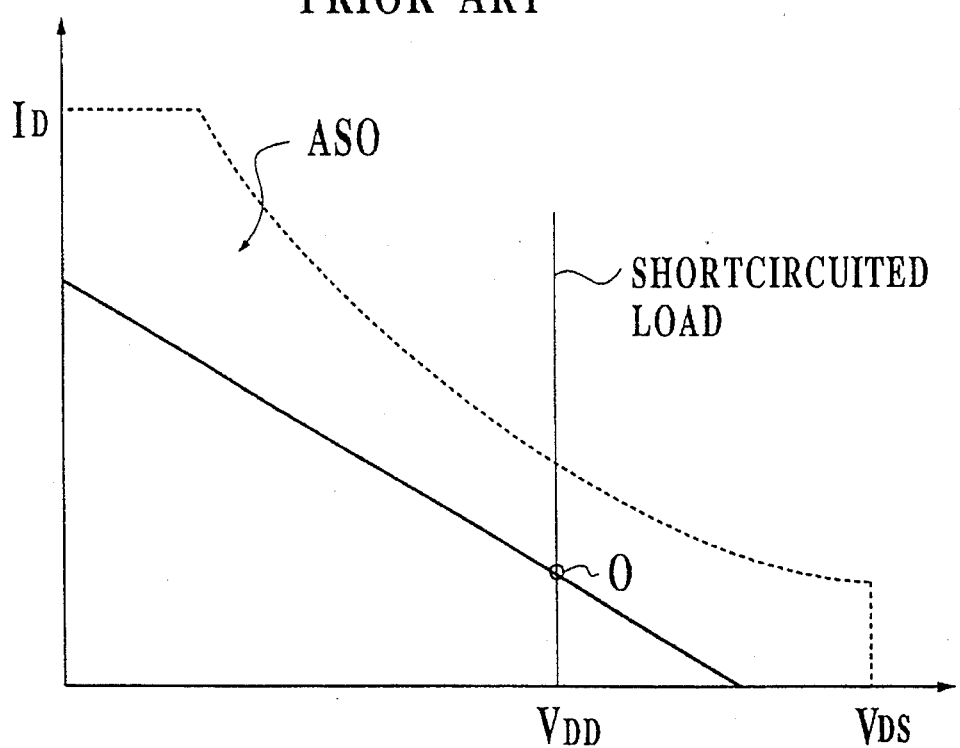
FIG. 2B represents I-V characteristics of this load drive circuit.

As apparent from the foregoing description about the negative resistance characteristics of the first MOS type power switching device 100, if the power supply voltage "$V_{DD}$" is selected to be higher than the peak drain voltage "$V_{DS-P}$", the MOS type power switching element 101 can be prevented from being electrically destroyed even when a load (not shown in detail) of this power switching element is short-circuited, similar to the conventional MOS type power switching device shown in FIG. 1A. Precisely speaking, when the load is short-circuited and thus the power supply voltage "$V_{DD}$" is directly applied to this first MOS type power switching device 100, the operation point of this switching device 100 is moved to a point "C". Since this operation point "C" is located within the ASO (area of safety operation) region of this first MOS type power switching device 100, the MOS type power switching element 101 can be sufficiently protected against such a high drain current condition (i.e., short-circuit), namely high heat dissipation.

Figure 3:
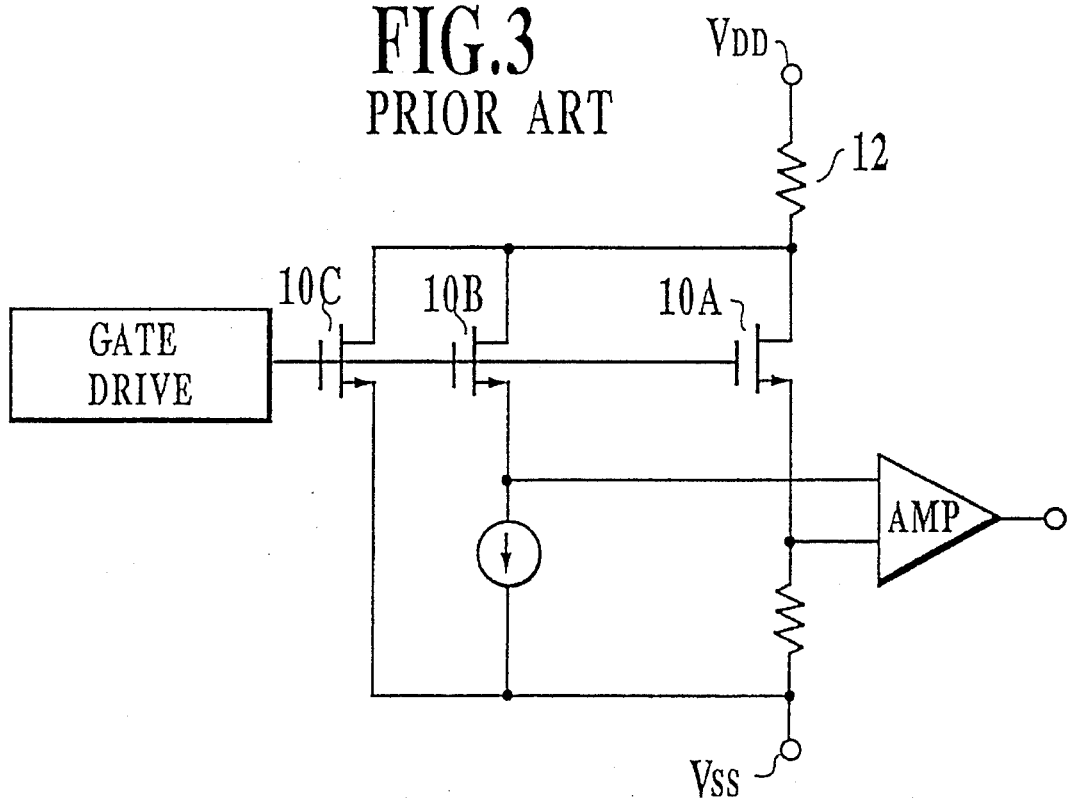
FIG. 3 indicates a circuit diagram of the current mirror type current sensing circuit using another conventional MOS type power semiconductor switching device.

Referring now to the previous I-V characteristics curve shown in FIG. 4, a comparison is made as follows. The I-V characteristics curve of this first MOS type power switching device 100 is indicated as numeral 50. Numeral 20 indicates the above-described I-V characteristics of the conventional current mirror type load protection circuit shown in FIG. 3, whereas numeral 30 represents the I-V characteristics of a conventional MOS type power switching device (not shown) without device protection function. As apparent from these I-V characteristics curves 20, 30 and 50, the power consumption of the first MOS type power switching device 100 during the load short-circuit condition can be considerably reduced, as compared with that of these conventional MOS type power switching devices. As a consequence, since the overall ASO region of this first MOS type power switching device 100 may be set to a narrow region, the resultant switching device 100 may be made compact, and a degree of device design may be improved.

It should be noted that the region why such negative resistance characteristics appear in the I-V characteristics curve 50, is to construct this first MOS type power switching device 100 with such an arrangement as shown in FIG. 5A. That is, before the drain current $I_D$ reaches the peak drain current "$I_{D-P}$", the ON-resistance values of the MOS type elements 101 and 102 are low. Then, the bipolar type controlling element 103 is turned ON after this drain current $I_D$ has reached the peak value $I_{D-P}$ and the drain voltage $V_{DS}$ is further increased from the peak drain voltage $V_{DS-P}$. This phenomenon may be proved from the above-described equation (5), namely a quadric function ($V_{DS}^2$) of the drain voltage "$V_{DS}$" in the right term thereof

Other Features of First MOS Type Power Switching Device 100

In general, when the load condition is normal, a sufficient current driveability is required to this first MOS type power switching device 100. As also obvious from the I-V characteristics shown in FIG. 5B, both of the peak drain current "$I_{D-P}$" and the peak drain voltage "$V_{DS-P}$" must be selected to be high in order to obtain such a sufficient current driveability. Then, to set the high peak drain voltage $V_{DS-P}$, the resistance value "$R_B$" of the resistor 104 may be selected to be large, for instance, several hundreds ohms (Ω) to approximately 1000 ohms, as easily understood from the above-described equation (6).

As a consequence, when the resistance value "$R_B$" of the resistor 104 is designed to obtain a proper value, this first MOS type power switching device 100 provides a sufficient current driveability with regard to the normal load condition, and furthermore can be prevented from being electrically destroyed during the abnormal load condition.

A description will now be made of the function of the resistor 104 employed in the first MOS type power switching device 100. The function of this resistor 104 is to limit the current "$I_B$" flowing through the MOS type semiconductor device 102. This current $I_B$ is not proportional to the current $I_D$ of the MOS type power switching element 101. This function is completely different from that of the current mirror type protection circuit. For instance, Japanese Laid-open patent application No. 2-226407 opened on Sep. 10, 1990 filed by the Applicant discloses the power MOSFET with the overcurrent protection function in which the resistor "Ra" is connected between the source of one current mirror type MOSFET "M2" and the base of the bipolar transistor T1 (see FIG. 6). This resistor Ra has the completely different effect from the above-described function of the resistor 104 employed in the first MOS type power switching device 100. That is to say, the power MOSFET shown in FIG. 6 of the above-described prior patent application No. 2-226407 constitutes a current mirror type circuit. It is so designed that the current "i" flowing through the current mirror MOSFET "M2" is directly proportional to the current "I" flowing through the main MOSFET "M1" when the bipolar transistor "T1" is turned ON. Then, this resistor Ra is employed so as to set the operation point of the bipolar transistor T1 and also to realize a stable operation thereof. However, if the resistance value of this resistor Ra becomes large, then the current "i" is not directly proportional to the current "I" so that no current mirror-operation is performed. Therefore, the resistance value of this resistor "Ra" must be set to a small value as being permitted as possible in order not to deteriorate the characteristics of the above-explained current mirror circuit.

To the contrary, as previously explained, since the first MOS type power switching device 100 employs no current mirror circuit, the resistance value of the resistor 104 may be freely determined as large values, e.g., several hundreds ohms to 1000 ohms, depending upon requirements of the current driveability (see equation 6).

Moreover, the above-described power MOSFET shown in FIG. 6 of the prior patent application No. 2-226407 corresponds to such a current mirror type overcurrent protection circuit that when an overcurrent flows through the main MOSFET "M1" which may cause the bipolar transistor T1 to be turned ON, a voltage drop appears across the resistor "Ri". Accordingly, a difference is produced between the gate voltage of the main MOSFET "M1" and the gate voltage of the current mirror MOSFET "M2", which may limit only the current "I" flowing through the main MOSFET "M1". As a consequence, the I-V characteristics of this current mirror type overcurrent protection circuit corresponds to the above-explained I-V characteristics 20 represented in FIG. 4. In other words, this I-V characteristics 20 of the current mirror type overcurrent protection circuit shown in FIG. 6 is completely different from the I-V characteristics 50 of the first preferred embodiment.

As apparent from the foregoing description, in accordance with the MOS type power switching device 100 of the first preferred embodiment, only a demand is required for the MOS type semiconductor device 102 such that an ON-resistance value thereof is sufficiently small, as compared with the resistance value $R_B$ of the resistor 104. Accordingly, this MOS type semiconductor device 102 may be constructed with a different structure from that of the MOS type power switching element 101. For instance, the MOS type power switching element 101 may be constructed of a vertical DMOS (double diffused metal-oxide FET semiconductor), whereas the MOS type semiconductor device 102 may be constructed of a lateral MOSFET. It should be understood that there is merit in the manufacturing steps if both of these MOS type elements 101 and 102 were to be made with the same type of semiconductor structure.

Circuit Arrangement/Operation of a Second MOS Type Power Switching Device 200

Figure 6A:
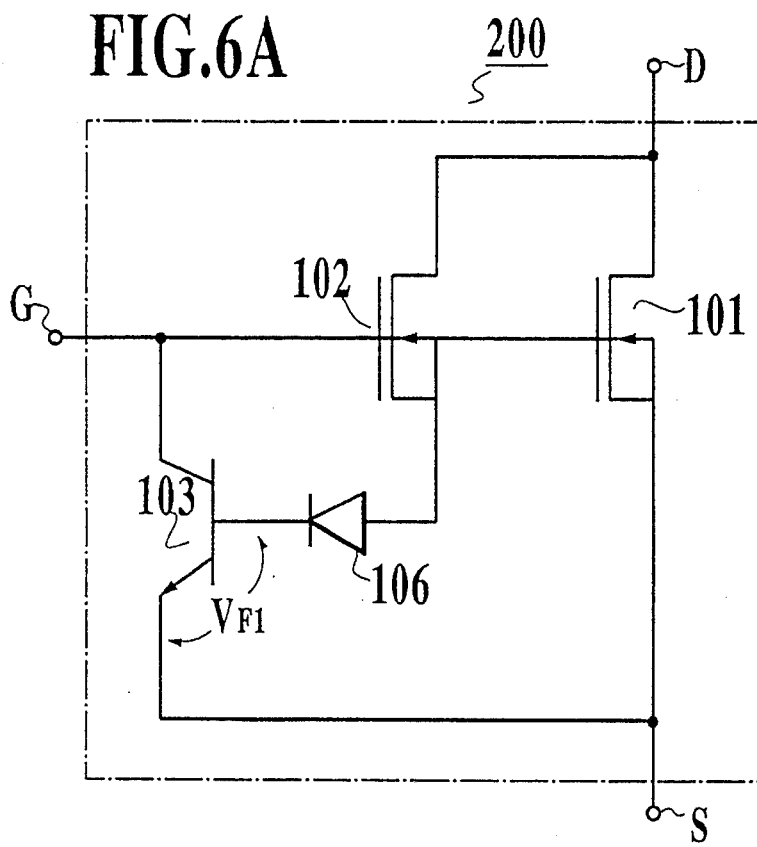
FIG. 6A indicates an internal circuit arrangement of another MOS type power switching device 200 according to a second preferred embodiment of the present invention.

FIG. 6A represents an internal circuit arrangement of another MOS type power switching device 200 according to a second preferred embodiment of the present invention.

As easily seen from a comparison between the first MOS type power switching device 100 of FIG. 5A and the second MOS type power switching device 200 of FIG. 6A, this second MOS type power switching device 200 newly employs a diode 106, instead of the resistor 104 in the first MOS type power switching device 100.

The featured operation of the second MOS type power switching device 200 will now be explained. In accordance with the above-defined equation (6), the peak drain voltage "$V_{DS-P}$" may be controlled based on the forward biasing voltage "$V_F$" applied between the base and the emitter of the bipolar type semiconductor controlling element 103 in a similar manner to the above-described resistance value "$R_B$" of the resistor 104. As a result, the second MOS type power switching device 200 can have the similar operation effect as that of the first MOS type power switching device 100.

Figure 6B:
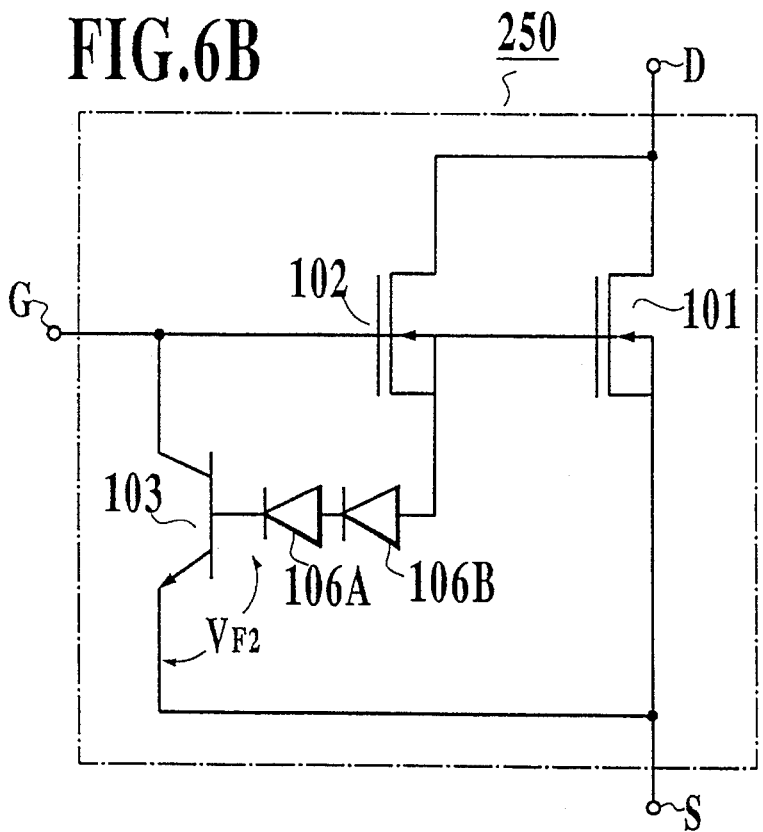
FIG. 6B shows an internal circuit arrangement of a modified second MOS type power switching device 250 of the present invention.

FIG. 6B represents an internal circuit arrangement of a modified second MOS type power switching device 250. In this modified second MOS type power switching device 150, two diodes 106A and 106B are series-connected to each other, and similarly interposed between the base of the bipolar type semiconductor controlling element 103 and the source of the MOS type semiconductor device 102.

In the second MOS type power switching device 200, the forward biasing voltage "$V_{F1}$" corresponds to a voltage obtained by adding a forward biasing voltage applied between the anode and cathode of a single diode 106 to the forward biasing voltage applied between the base and emitter of the controlling element 103. As a result, since the peak drain voltage "$V_{DS-P}$" becomes large, the second MOS type power switching device 200 can own a sufficient current driveability with respect to the normal load condition.

Furthermore, since the modified second MOS type power switching device 250 employs two diodes 106A and 106B, the current driveability thereof is further improved, as compared with the second MOS type power switching device 200.

Circuit Arrangement/Operation of Third MOS Type Power Switching Device 300

Figure 7:
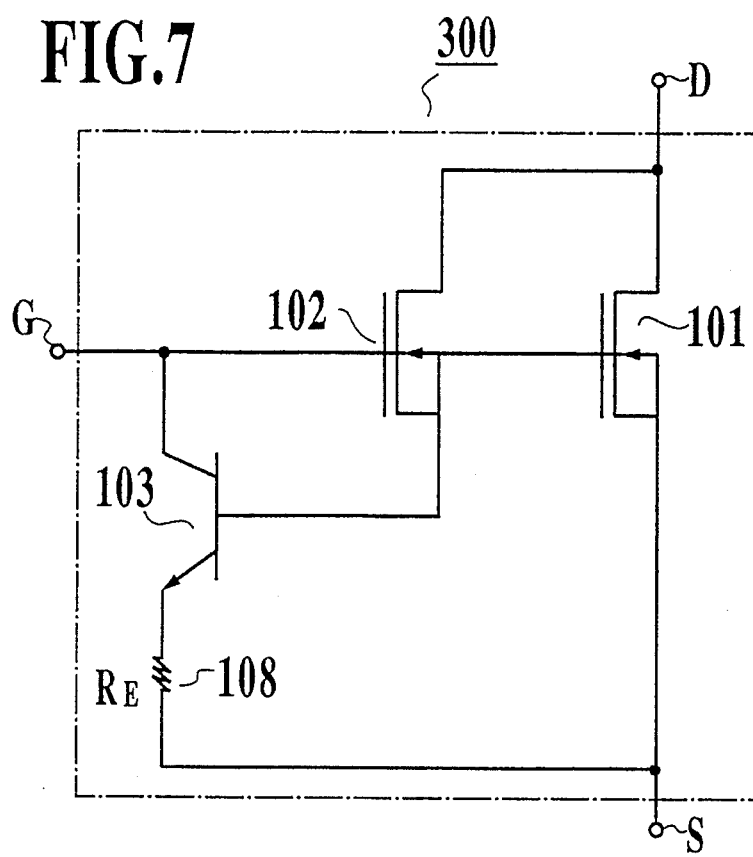
FIG. 7 represents an internal circuit arrangement of a third MOS type power switching device 300 of the present invention.

FIG. 7 shows an internal circuit arrangement of another MOS type power switching device 300 according to a third preferred embodiment of the present invention. A featured circuit arrangement of this third MOS type power switching device 300 is so constructed that the source of the MOS type semiconductor device 102 is directly connected to the base of the bipolar type semiconductor controlling element 103, and an emitter resistor 108 having a resistance value "$R_E$" is interposed between the emitter of this bipolar type controlling element 103 and the source terminal 3.

Figure 4:
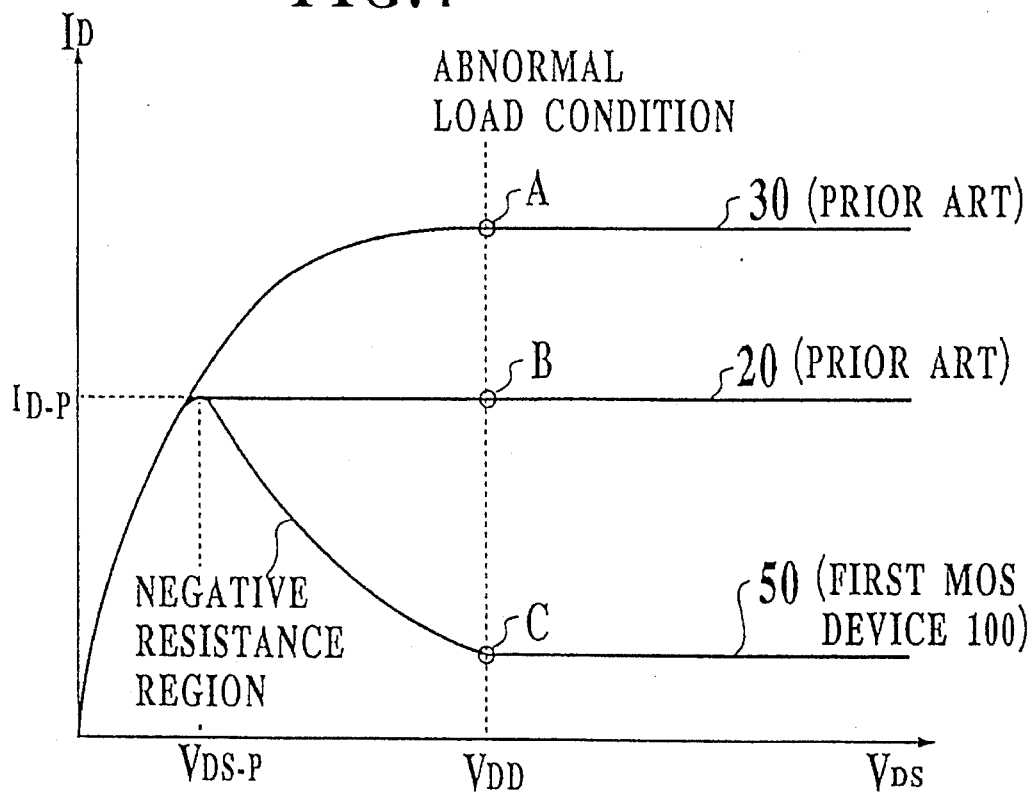
FIG. 4 represents various I-V characteristics of the prior art devices and the inventive device.

I-V characteristics of this third MOS type power switching device 300 is similar to that of the first MOS type power switching device 100 (see FIG. 4). It should be noted that the peak drain current "$I_{D-P}$" and the peak drain voltage "$V_{DS-P}$" are controlled by varying the resistance value "$R_E$" of the emitter resistor 108. Accordingly, the third MOS type power switching device 300 can have a sufficient current driveability with respect to the normal load condition, and also can be effectively protected from overcurrent destroy thereof by properly designing the resistance value $R_E$ of this emitter resistor 108.

Furthermore, while no gate voltage is applied to the gate terminal "G" of this third MOS type power switching device 300, and thus both of the MOS type power switching element 101 and the MOS-type semiconductor device 102 are turned OFF, there is no current path from the drain terminal "D" and the source terminal "S" of the third MOS type power switching device 300, similar to that of the first MOS type power switching device 100. As a consequence, power consumption during the OFF state caused by the leak current can be considerably reduced, as compared with the conventional MOS type power switching device.

Circuit Arrangement/Operation of Fourth MOS Type Power Switching Devices 400/500

Figure 8A:
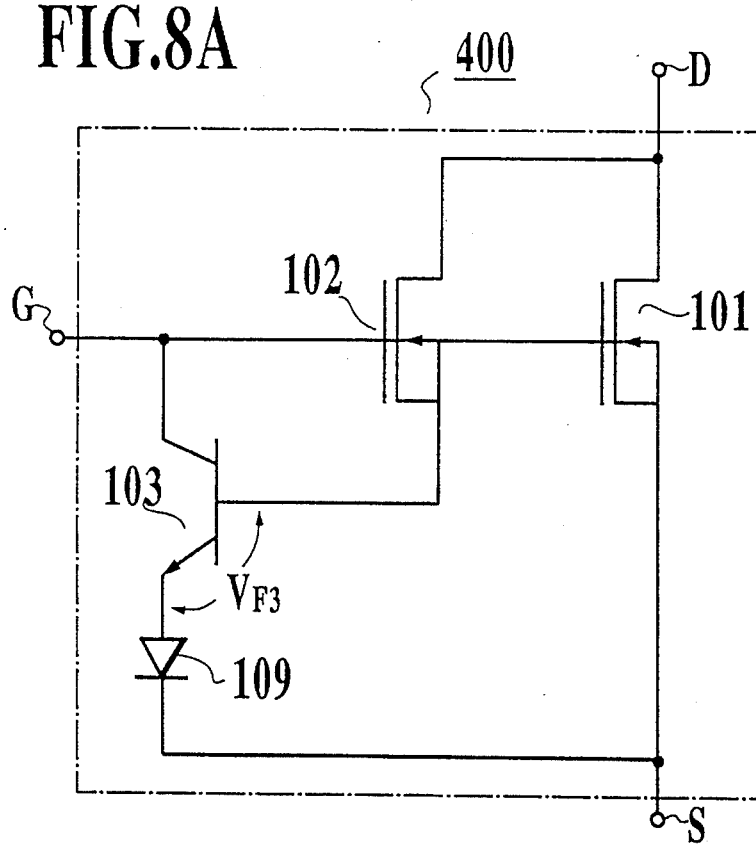
FIG. 8A denotes an internal circuit arrangement of a fourth MOS type power switching device 400 of the present invention.
Figure 8B:
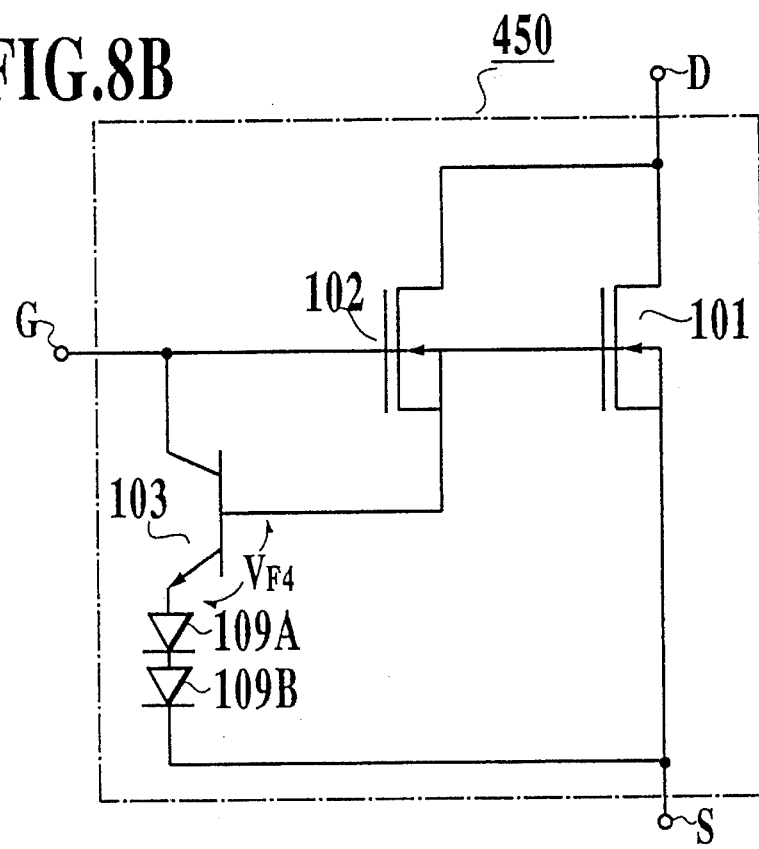
FIG. 8B indicates an internal circuit arrangement of a modified fourth MOS type power switching device 450 of the present invention.

FIG. 8A shows an internal circuit arrangement of a fourth MOS type power switching device 400, and FIG. 8B indicates an internal circuit arrangement of a modified fourth MOS type power switching device 450 according to the present invention.

As seen from these circuit diagrams of FIGS. 8A and 8B, a forward biasing voltage "$V_{F3}$", or "$V_{F4}$" applied between the emitter and base of the bipolar type controlling element 103 can be selected to a desirable voltage by employing a single diode 109, or two series-connected diodes 109A and 109B, so that the fourth MOS type power switching device 400 and the modified fourth MOS type power switching device 450 can have the similar advantages, i.e., no leak current and a high current driveability to those of the first MOS type power switching device 100.

Circuit Arrangement/Operation of Fifth MOS Type Power Switching Device 500

Figure 9:
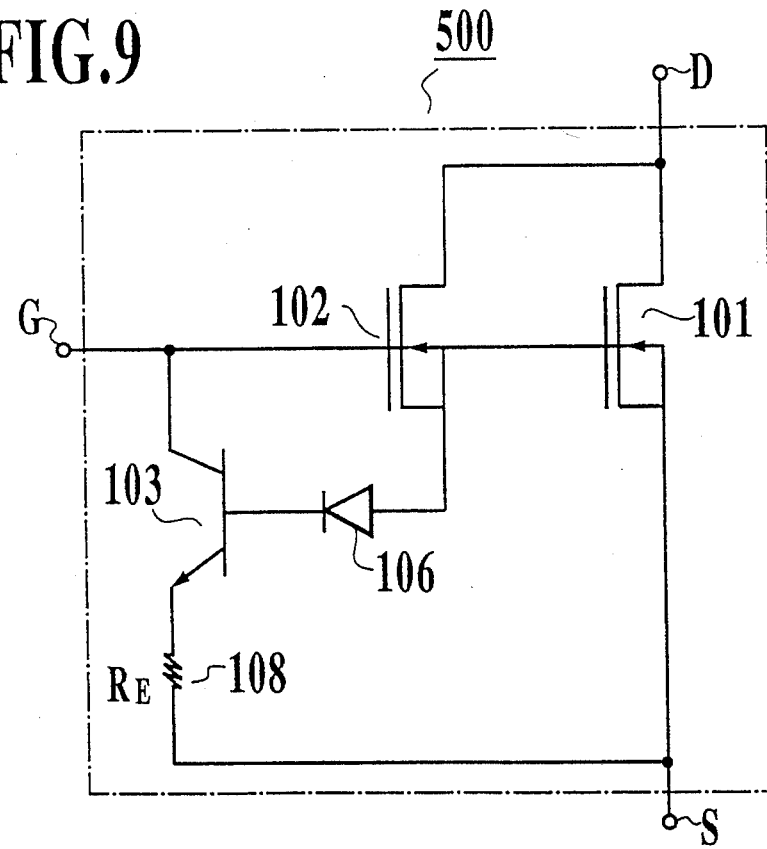
FIG. 9 shows an internal circuit arrangement of a fifth MOS type power switching device 500 of the present invention.

In FIG. 9, there is shown an internal circuit arrangement of another MOS type power switching device 500 according to a fifth preferred embodiment of the present invention. A feature of this fifth MOS type power switching device 500 is to employ both of a base diode 106 and an emitter register 108 to the bipolar type semiconductor device 103, which namely corresponds to a combination circuit with the third MOS type power switching device 300 of FIG. 7 and the fourth MOS type power switching device 400 of FIG. 8A. In addition, this fifth MOS type power switching devices 500 may be modified by substituting the base diode 106 and emitter resistor 108 by a base resistor and an emitter diode (not shown in detail). These fifth MOS type power switching device 500 and the modified device thereof can have merits similar to those of the first preferred embodiment, and furthermore own advantages such that the degree of design freedom is improved, as compared with other switching devices.

Circuit Arrangement/Operation of Sixth MOS Type Power Switching Device 600

Figure 10:
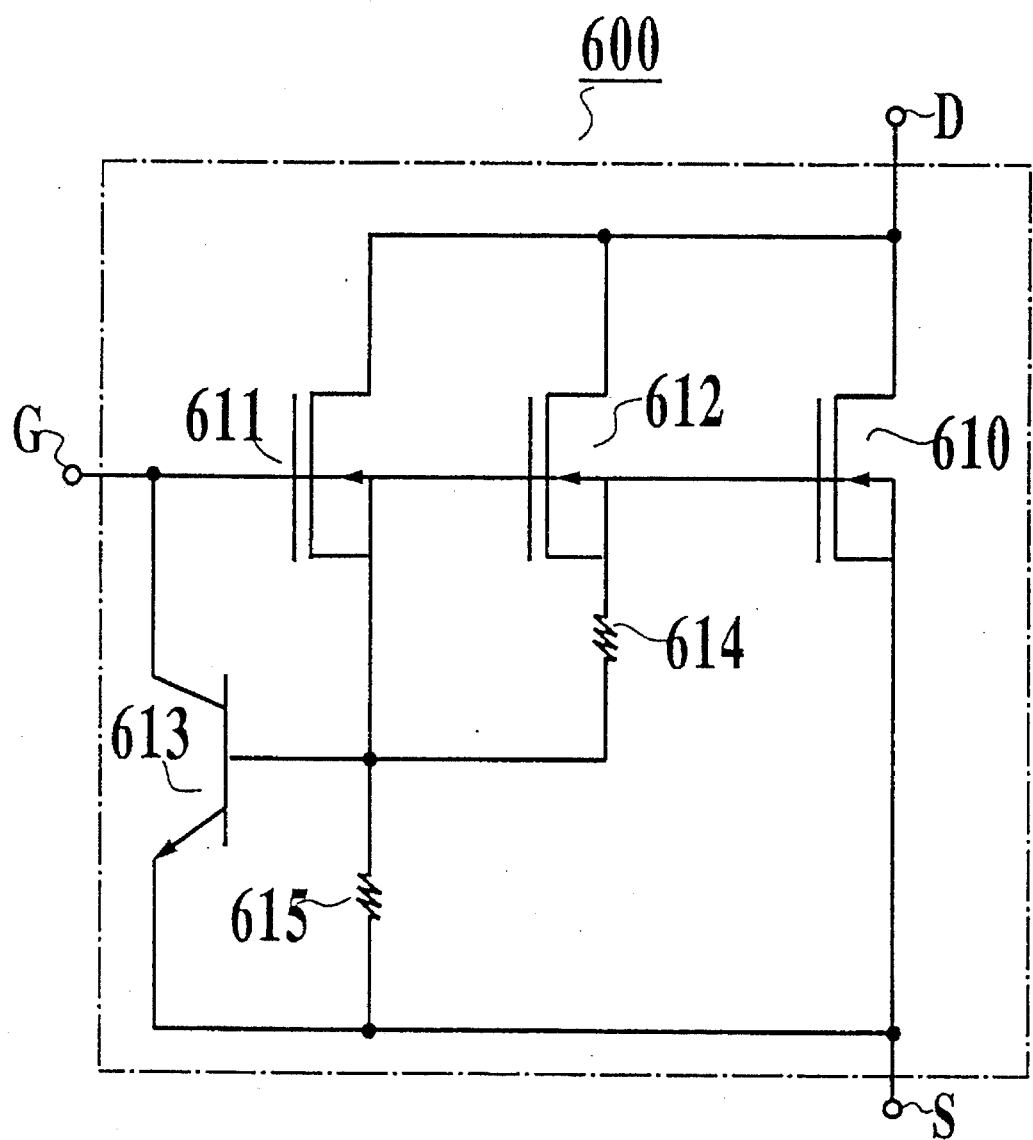
FIG. 10 represents an internal circuit arrangement of a sixth MOS type power switching device 600 of the present invention.

FIG. 10 shows an internal circuit arrangement of a further MOS type power switching element 600 according to a sixth preferred embodiment of the present invention.

A major feature of the sixth MOS type power switching element 600 is such that although the entire circuit of this sixth MOS type power switching element 600 is more or less similar to that of the above-explained conventional MOS type power switching device indicated in FIG. 1A, there are the following particular differences. That is, one end of a base resistor 614 is not directly connected to the drain terminal "D" of the fifth MOS type power switching device 500, but connected via a second MOS type semiconductor 612 to this drain terminal "D". The MOS type power switching element 610, first MOS type semiconductor device 611, bipolar type semiconductor controlling element 613, and another resistor 615 are connected in a similar circuit arrangement to the conventional MOS type power switching device of FIG. 1A.

In the sixth MOS type power switching device 600, when no gate biasing voltage is applied to the gate terminal "G" thereof, since the second MOS type semiconductor element 612 is turned OFF, no leak current flows from the drain terminal "D" to the source terminal "S". Consequently, power consumption caused by the leak current under the OFF state can be greatly reduced, as compared with that of the conventional MOS type power switching device.

As previously described in detail, since the MOS type power switching devices according to the present invention are so constructed that the current-to-voltage characteristics partially represent the negative resistance characteristics, and also the MOS type semiconductor devices are provided in all signal paths defined from the drain terminal to the source terminal, there are various advantages. First, the MOS type power switching devices can have the sufficient current driveability with respect to the normal load condition, and the drain currents thereof can be reduced during the abnormal load condition such as a load short-circuit state. Accordingly, the MOS type power switching devices can be continuously operated within the ASO region even under such a load short-circuit condition. Moreover, when the MOS type power switching devices are turned OFF, the power consumption due to the leak current can be greatly reduced.

What is claimed is:

1. A MOS (metal-oxide semiconductor) type power switching device with a drain terminal, a source terminal and a gate terminal, having a negative resistance drain current vs. drain voltage characteristic, comprising:

a MOS type power switching element whose drain, source and gate are directly connected to said drain, source and gate terminals, respectively;

a MOS type semiconductor device whose drain is connected to said drain of the MOS type power switching element and whose gate is directly connected to said gate terminal together with the gate of said MOS type power switching element;

a bipolar semiconductor controlling element whose collector is connected to said gate terminal together with both of said gates of the MOS type power switching element and of the MOS type semiconductor element, and whose emitter is connected to said source terminal together with said source of the MOS type power switching element; and a current limiting element connected between a source of said MOS type semiconductor device and a base of said bipolar type controlling element, whereby said bipolar semiconductor controlling element is in a conductive state when said MOS type semiconductor device is in an on condition, and said MOS type power switching element and said MOS type semiconductor device are simultaneously turned on and turned off by a voltage applied to said gate terminal.

2. A MOS type power switching device as claimed in claim 1, wherein said current limiting element is a resistor having a resistance value lower than an ON-resistance value of said MOS type semiconductor device.

3. A MOS type power switching device as claimed in claim 2, wherein said resistance value of said resistor is selected to be approximately 100 ohms to 1000 ohms.

4. A MOS type power switching device as claimed in claim 2, wherein said MOS type power switching element is constructed of any one of a power MOSFET and an IGBT, said MOS type semiconductor device is arranged by any one of a vertical MOSFET, a lateral MOSFET, a vertical IGBT, a lateral IGBT, and a TFT type MOSFET, and said bipolar type semiconductor controlling element is constructed of any one of a bipolar transistor and a thin film bipolar transistor.

5. A MOS (metal-oxide semiconductor) type power switching device with a drain terminal, a source terminal and a gate terminal, having a negative resistance drain current vs. drain voltage characteristic, comprising:

a MOS type power switching element whose drain, source and gate are directly connected to said drain, source and gate terminals, respectively;

a MOS type semiconductor device whose drain is connected to said drain of the MOS type power switching element and whose gate is directly connected to said gate terminal together with the gate of said MOS type power switching element;

a bipolar semiconductor controlling element whose collector is connected to said gate terminal together with both of said gates of the MOS type power switching element and of the MOS type semiconductor element, and whose emitter is connected to said source terminal together with said source of the MOS type power switching element; and a forward biasing voltage controlling element connected between a source of said MOS type semiconductor device and a base of said bipolar type controlling element, for controlling a forward biasing voltage applied between said base and emitter of said bipolar type controlling element.

6. A MOS type power switching device as claimed in claim 5, wherein said forward biasing voltage controlling element is constructed of any one of a single diode and a series-connected diode circuit.

7. A MOS type power switching device as claimed in claim 5, wherein said MOS type power switching element is constructed of any one of a power MOSFET and an IGBT, said MOS type semiconductor device is arranged by any one of a vertical MOSFET, a lateral MOSFET, a vertical IGBT, a lateral IGBT, and a TFT type MOSFET, and said bipolar type semiconductor controlling element is constructed of any one of a bipolar transistor and a thin film bipolar transistor.

8. A MOS (metal-oxide semiconductor) type power switching device with a drain terminal, a source terminal and a gate terminal, having a negative resistance drain current vs. drain voltage characteristic, comprising:

a MOS type power switching element whose drain, source and gate are directly connected to said drain, source and gate terminals, respectively;

a MOS type semiconductor device whose drain is connected to said drain of the MOS type power switching element and whose gate is directly connected to said gate terminal together with the gate of said MOS type power switching element;

a bipolar semiconductor controlling element whose collector is connected to said gate terminal together with both of said gates of the MOS type power switching element and of the MOS type semiconductor element, and whose emitter is connected to said source terminal together with said source of the MOS type power switching element; and a resistor connected between an emitter of the bipolar type controlling element and said source of said MOS type power switching device in order to control both of a peak drain current of said MOS type power switching device and a peak drain voltage thereof.

9. A MOS type power switching device as claimed in claim 8, wherein said MOS type power switching element is constructed of any one of a power MOSFET and an IGBT, said MOS type semiconductor device is arranged by any one of a vertical MOSFET, a lateral MOSFET, a vertical IGBT, a lateral IGBT, and a TFT type MOSFET, and said bipolar type semiconductor controlling element is constructed of any one of a bipolar transistor and a thin film bipolar transistor.

10. An MOS (metal-oxide semiconductor) type power switching device with a drain terminal, a source terminal and a gate terminal, having a negative resistance drain current vs. drain voltage characteristic, comprising:

an MOS type power switching element whose drain, source and gate are directly connected to said drain, source and gate terminals, respectively;

a MOS type semiconductor device whose drain is connected to said drain of the MOS type power switching element and whose gate is connected to said gate terminal together with the gate of said MOS type power switching element;

a bipolar semiconductor controlling element whose collector is connected to said gate terminal together with both of said gates of the MOS type power switching element and of the MOS type semiconductor element, and whose base is connected to a source of said MOS type semiconductor device; and a forward biasing voltage controlling element connected between an emitter of said bipolar type semiconductor controlling element and said source of the MOS type power switching element, for controlling a forward biasing voltage applied between said base and emitter of said bipolar type controlling element.

11. A MOS type power switching device as claimed in claim 10, wherein said forward biasing voltage controlling element is constructed of any one of a single diode and a series-connected diode circuit.

12. A MOS type power switching device as claimed in claim 10, wherein said MOS type power switching element is constructed of any one of a power MOSFET and an IGBT, said MOS type semiconductor device is arranged by any one of a vertical MOSFET, a lateral MOSFET, a vertical IGBT, a lateral IGBT, and a TFT type MOSFET, and said bipolar type semiconductor controlling element is constructed of any one of a bipolar transistor and a thin film bipolar transistor.

13. A MOS (metal-oxide semiconductor) type power switching device with a drain terminal, a source terminal and a gate terminal, comprising:

a MOS type power switching element whose drain is connected to said drain terminal and whose source is connected to said source terminal;

a MOS type semiconductor device whose drain is connected to said drain of the MOS type power switching element and whose gate is connected to said gate terminal together with a gate of said MOS type power switching element;

a bipolar semiconductor controlling element whose collector is connected to said gate terminal together with both of said gates of the MOS type power switching element and of the MOS type semiconductor element;

a diode connected between a source of said MOS type semiconductor device and a base of said bipolar type controlling element; and a resistor connected between an emitter of said bipolar type controlling element and said source of said MOS type power switching element when no gate biasing voltage is being applied to said gate terminal, at least said MOS type semiconductor device being turned OFF, whereby no current flows from said drain terminal to said source terminal through any current paths.

14. A MOS type power switching device as claimed in claim 13, wherein said MOS type power switching element is constructed of any one of a power MOSFET and an IGBT, said MOS type semiconductor device is arranged by any one of a vertical MOSFET, a lateral MOSFET, a vertical IGBT, a lateral IGBT, and a TFT type MOSFET, and said bipolar type semiconductor controlling element is constructed of any one of a bipolar transistor and a thin film bipolar transistor.

15. A MOS (metal-oxide semiconductor) type power switching device with a drain terminal, a source terminal and a gate terminal, comprising:

a MOS type power switching element whose drain is connected to said drain terminal and whose source is connected to said source terminal;

a first MOS type semiconductor device whose drain is connected to said drain of the MOS type power switching element and whose gate is connected to said gate terminal together with a gate of said MOS type power switching element;

a second MOS type semiconductor device whose drain is commonly connected to both of said drains of the MOS type power switching element and the first MOS type semiconductor device, and whose gate is commonly connected to both of said gates of the MOS type power switching element and the first MOS type semiconductor device;

a bipolar semiconductor controlling element whose collector is connected to said gate terminal together with said gates of the MOS type power switching element and of said first and second MOS type semiconductor devices, and whose emitter is connected to said source terminal;

a first resistor connected between a source of said second MOS type semiconductor device and a base of said bipolar semiconductor controlling element; and a second resistor parallel-connected between said base of the bipolar semiconductor controlling element and said emitter thereof, when no gate biasing voltage is being applied to said gate terminal, at least said second MOS type semiconductor device being turned OFF, whereby no current flows from said drain terminal to said source terminal through any current paths.

16. A MOS type power switching device as claimed in claim 15, wherein said MOS type power switching element is constructed of any one of a power MOSFET and an IGBT, said MOS type semiconductor device is arranged by any one of a vertical MOSFET, a lateral MOSFET, a vertical IGBT, a lateral IGBT, and a TFT type MOSFET, and said bipolar type semiconductor controlling element is constructed of any one of a bipolar transistor and a thin film bipolar transistor.

* * * * *